United States Patent [19]

Dirmeyer et al.

[11] Patent Number: 4,733,206

[45] Date of Patent: Mar. 22, 1988

[54] CONNECTOR PLUG WITH AN INTEGRATED ELECTRICAL RADIO FREQUENCY SUPPRESSION FILTER

[75] Inventors: Josef Dirmeyer, Bodenwoehr; Heinz Kathmann, Regensburg; Franz Merkle, Ottobrunn; Franz Oberberger, Moetzing; Walter Wilhelm, Wenzenbach; Josef Wimmer, Regenstauf, all of Fed. Rep. of Germany

[73] Assignee: Siemens Aktiengesellschaft, Berlin and Munich, Fed. Rep. of Germany

[21] Appl. No.: 762,509

[22] Filed: Aug. 5, 1985

[30] Foreign Application Priority Data

Sep. 4, 1984 [DE] Fed. Rep. of Germany ....... 3432502

[51] Int. Cl.$^4$ .............................................. H03H 7/01
[52] U.S. Cl. ..................................... 333/181; 333/167; 333/185
[58] Field of Search ................ 333/167, 168, 181–185; 29/592, 825, 828, 837; 361/331, 332, 397, 400, 405, 406, 409, 415, 417

[56] References Cited

U.S. PATENT DOCUMENTS

| | | | |
|---|---|---|---|
| 2,939,095 | 5/1960 | Chertok | 333/167 |
| 3,501,582 | 3/1970 | Heidler et al. | 174/52 PE |
| 3,780,431 | 12/1973 | Feeney | 29/837 X |
| 4,205,891 | 6/1980 | Rieman et al. | 339/126 R |
| 4,563,659 | 1/1986 | Sakamoto | 333/185 X |

FOREIGN PATENT DOCUMENTS

| | | |
|---|---|---|
| 0113465 | 7/1984 | European Pat. Off. . |
| 520447 | 4/1972 | Switzerland . |
| 820687 | 9/1959 | United Kingdom . |

OTHER PUBLICATIONS

"EMC EMI Suppression Components, Filters Data Book 1983–1984", Siemens Aktiengesellschaft; pp. 32–32.

"International Electrotechnical Commission IEC Standard", Publication 384–14, First Edition, 1981, Bureau Central de la Commission Electrotechnique Internationale Geneva; pp. 3–55.

Primary Examiner—Marvin L. Nussbaum
Attorney, Agent, or Firm—Hill, Van Santen, Steadman & Simpson

[57] ABSTRACT

A connector plug has an integrated electrical radio frequency (RF) suppression filter comprising a metallic filter housing which is slipped over the connector plug and electrically contacted to a ground conductor which extends from one end of the device to the other. The ground conductor is designed with a broad surface and is preferably in the form of a cross-shaped member in a central region and having ends connected to the terminal elements of Y-capacitors of the RF filter. The ground conductor is separated from the electrical filter components by an insulating lamina and the overall arrangement is encapsulated with plastic to form the plug prior to receiving the metallic housing thereover.

11 Claims, 5 Drawing Figures

CONNECTOR PLUG WITH AN INTEGRATED ELECTRICAL RADIO FREQUENCY SUPPRESSION FILTER

CROSS REFERENCE TO RELATED APPLICATION

This application is related to application Ser. No. 762,443, filed Aug. 5, 1985.

BACKGROUND OF THE INVENTION

The present invention relates to a connector plug comprising an electrical radio frequency (RF) suppression filter connected between the power supply and utilization device terminals of the connector plug and integrated into the plug, and which has a metallic filter housing slipped onto the plug and electrically connected to the ground conductor which extends over the full length of the RF suppression filter, the device terminals, particularly tabs, pigtails, pin plugs and the like extending out of the metallic filter housing at an open end facing the side of the utilization device.

DESCRIPTION OF THE PRIOR ART

Among other things, the RF suppression filters of the type generally set forth above are intended for use in desk-type computers, office machines and medical apparatus. The essential job of the RF suppression filter is to reduce the line-bound noise level. Sine, due to their type of utilization, these filters are exposed in the environment of their use to high electrical and magnetic field strength levels, it must be provided that their noise suppression effect is not reduced by electrical and magnetic in-coupling onto the wiring or, respectively, the components of the filter circuit. These problems occur to a high degree particularly given their use in electrical devices having switched power supplies and/or in microprocessor systems having long bus lines. Insofar as attempts have already been made in order to resolve these problems, these are comprised, for example in the utilization of a metal housing for the RF suppression filter, the housing being closed on all sides and the provision of insulated grommets for the leads. Deep-drawn housings of German silver or bipartite, tightly soldered housings of sheet iron thereby serve as metal housings.

Such filters have been disclosed, for example, as filters having an integrated rubber connector in which the leads extending from the power supply side are carried out by way of the rubber connector, generally a so-called jack, and the contacting to the device which is provided with the filter is carried out by way of tabs, pigtails, solder lugs and the like. In this regard, see, for example, the technical information from the Components Division published by Siemens AG under the title "Elektromagnetisch Verträglichkeit durch den Einsatz von Entstörfiltern", order number B/2418, particularly page 18, and the Siemens AG advertising brochure "Funk-Entstorfilter", delivery program 1980, 1981, pp. 12–13, obtainable under order number B/2284.

The leads and the carriers of the electrical components are thereby tightly glued in a half shell of German silver sheet. The electrical components in and of themselves in this RF suppression filter are mounted in the half shell, are isolated and soldered in manually. Proceeding from the open side of the half shell, the electrical components are subsequently first fixed with soft epoxy resin casting compound and are subsequently mechanically protected by a hard casting compound.

Instead of the German silver half-shell, other commercially available RF suppression filters employ a deep-drawn German silver housing. The components are thereby mounted in an auxiliary frame with flat plugs and soldered. The casting of the components and of the plug parts located in the filter housing occurs through a hole in the German silver housing which must be tightly connected to plug and frame by incorporating sealing rings. The casting hole is covered by a glued on type plate.

Other RF suppression filters commercially available use a soldered jacket tube of tin plate, whereby the electrical components are mounted on a carrier plate which is subsequently riveted to the plug. The soldering of the ground wire occurs through a hole in the jack tube which must be previously slipped onto the plug. The solder location is covered by a type plate. The casting of the electrical components thereby occurs proceeding from the open rear side of the jacket tube.

Finally, RF suppression filters are known, for example, from the Siemens AG data book 1982/84 "EMV Funk-Entstörung-Bauelement, Filter", page 240, which are distinguished by an effective magnetic shielding and good ratio frequency properties, can be manufactured with relatively low expense and meet the national and international regulations of these filters. These filters have a filter housing comprising inductances and capacitances integrated into the housing and embedded in casting compound, and comprise electrical leads particularly tabs, pigtails, pin plugs and the like, which extend out at open end faces of the filter housing and are connected to the electrical components. The filter housing is thereby lengthened such that the terminal elements facing outwardly of at least one lead are disposed shielded within the filter housing. For this purpose, the filter housing can, for example, be tapered shaft-like at its open end faces.

Although the manufacture of these filters is already possible with relatively low expense, it nonetheless requires manual activities, therefore, in part, solderings and complicated wiring operations which can only be manually executed.

SUMMARY OF THE INVENTION

It is therefore the object of the present invention to provide an electrical connector plug, particularly an IEC plug, having an RF suppression filter as set forth above which, among retention of the good RF shielding properties inherent in the last-discussed known RF suppression filters, as well as upon fulfillment of the corresponding national and international regulations, may be manufactured in an extremely cost-effective manner, i.e. in a way involving particularly little expense.

The above object is achieved, according to the present invention, in a connector plug which comprises an RF suppression filter connected between the power supply and the utilization device terminals and which is integrated into the plug, the filter comprising a metallic filter housing slipped onto the plug and electrically connected to a protective conductor which extends the full length of the RF suppression filter, the terminals, particularly tabs, pigtails, pin plugs and the like being conducted out of the metallic filter housing at the end facing the utilization device, that end being partially open, the invention being particularly characterized in that the ground conductor is designed with a broad surface, and preferably as a cross-shaped protective conductor in the region between its terminals, the one ends of the protective conductor being connected to terminal elements of Y-capacitors, the protective conductor being separated from the electrical filter components by an insulating lamina, and the terminals, in part, and the ground conductor together with the insulator lamina and filter components are encapsulated with plastics material. The protective conductor thereby preferably serves as a carrier of the insulating lamina.

Instead of the connector plug-shaped design of the plastic encapsulation, a simple, for example block-shaped encapsulation can also be provided from which the power supply and utilization device terminals fashioned as tabs, pigtails, pin plugs and the like are optionally conducted from opposite faces, namely at both sides under given conditions. The filter housing slipped onto this encapsulation can be closed with a corresponding cover in consideration of the insulated outwardly extension of these leads.

The manufacture of the above connected plugs or, respectively, RF suppression filters is simplified when a plurality of insulating laminae respectively equipped with the ground conductors, with the power supply terminals and with the utilization device terminals are combined by way of insulating webs to form a system carrier providing a simplification such that all systems can be respectively processed in common work steps.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
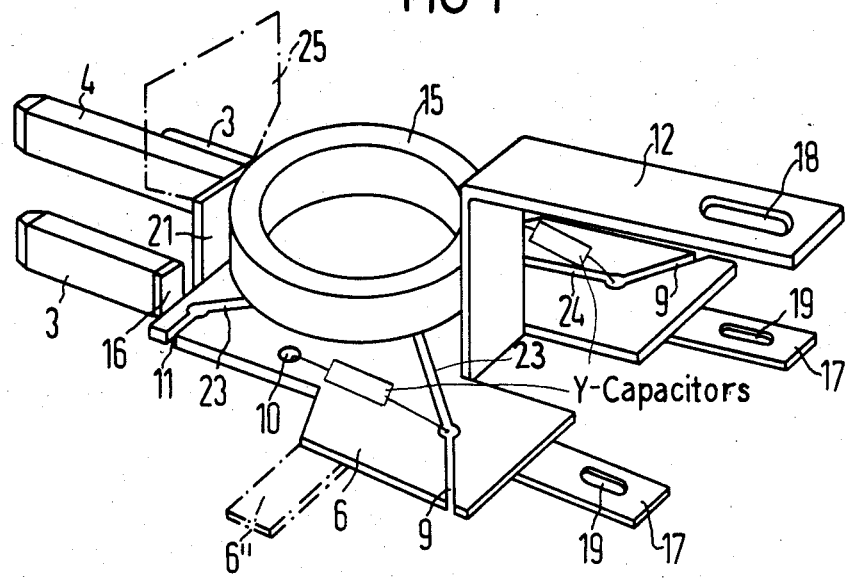
FIG. 1 is a perspective view of an exemplary embodiment of the invention, whereby the capacitor filter components, the casting of the arrangement in the form of a connector plug and the filter housing are not shown for reasons of clear illustration.

As a part of the connector plug, FIG. 1 illustrates pin-like electrical terminals 3, a ground conductor 4 and following electrical RF suppression filter of whose electrical filter components only a toroidal ring inductor 15 is schematically illustrated. The RF suppression filter is additionally equipped with a X-capacitor connected between the terminal elements 3 and with two Y-capacitors respectively connected from the utilization device side electrical terminal 17 to the ground conductor. Only the contactings of these elements to the terminals shall be explained below.

An insulating lamina 6 is provided at whose one side the electrical filter components are disposed and whose other side a broad-surface ground conductor 13 is provided (see FIG. 2) which is shaped as a cross-shaped protective conductor in its central region. The ground conductor 13 has its one, angled end 21 contacted to the ground conductor terminal 4. The end 12 of the ground conductor 13 which lies opposite and is likewise angled off is, as shall be explained later, electrically connected to the filter housing 30 (FIG. 3) which is slipped onto the finished connector.

Additional, angled terminal elements 16 has their one legs lying at the side of the ground conductor 13, their other legs being contacted to the end faces of the electrical terminals 3. These utilization device side terminals at the side of the ground conductor 13 partially lie against the insulating lamina 6. For contacting, for example with wires, the terminal 17 and the element 12 of the ground conductor are additionally fashioned with oblong holes 19 or, respectively, 18.

For facilitated contacting of the power supply side and of the utilization device side electrical terminals and of the ground conductor to the electrical filter components, the corresponding parts of the terminals 16, 17, the ends 14 of the cross-shaped ground conductor 13, and the insulating lamina 6 rae partially equipped with bores 10 and partially with slots 9, 11 open towards the edge of the insulating lamina, which slots can be expanded to form bores at their closed ends. The introduction of the, preferably, wire-shaped terminal elements of the winding ends 23, 24 of the toroidal core inductor 15 and of the X-capacitors (not shown) and Y-capacitors is facilitated by a funnel-shaped design of the slots. In the completely assembled condition of the electrical filter component, the winding ends 23, 24 of the toroidal core inductor 15 are conducted by way of the slot 9 or, respectively, 11 to the terminals 17 or, respectively, to the element 16, the X-capacitor has its terminals plugged into the ends of the slots 11 which are expanded into bores and the Y-capacitors are conducted from the bores 10 fo the terminal 17 to the bores 10 of the ground conductor 13. The contacting can thereby be carried out in a single work step by immersion soldering.

Figure 2:
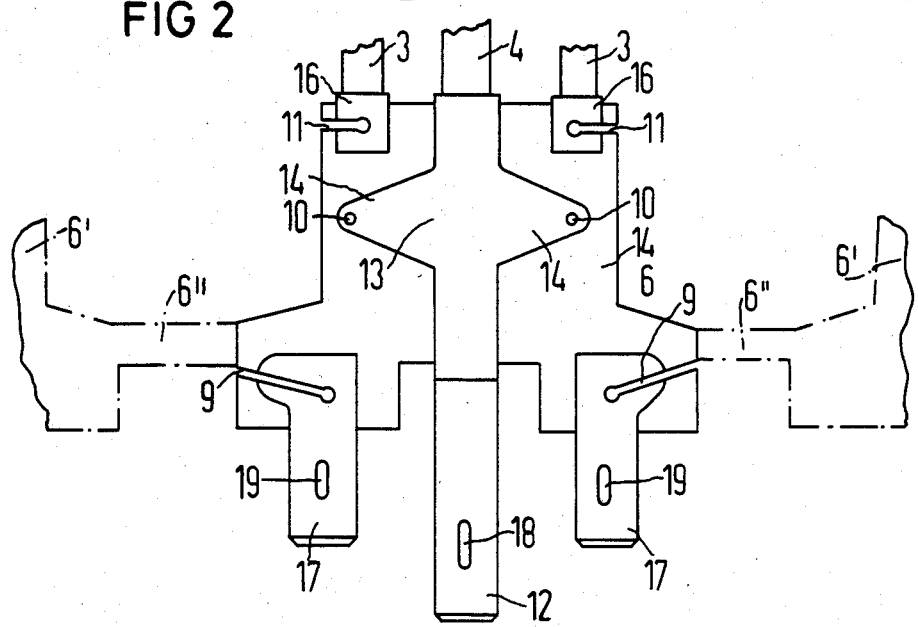
FIG. 2 is a partially broken illustration and bottom view of the arrangement of FIG. 1.
Figure 3:
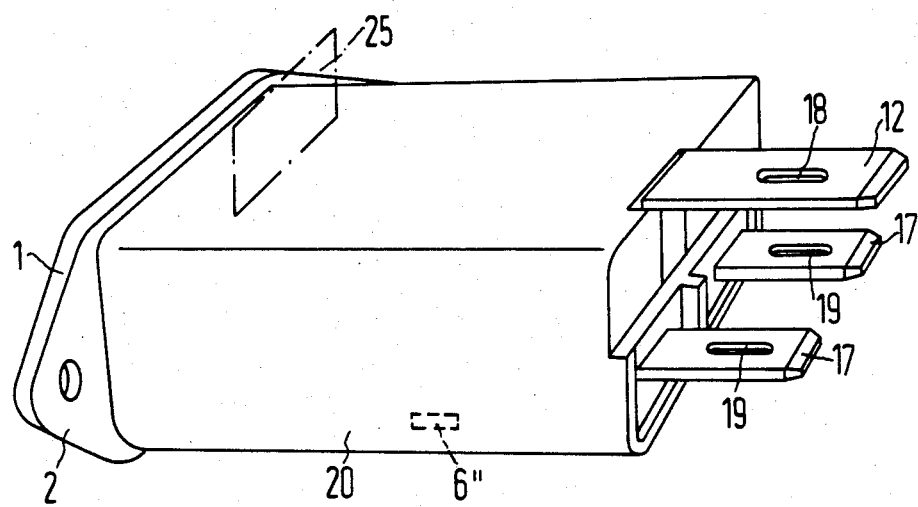
FIG. 3 is a perspective view of the arrangements of FIGS. 1 and 2 encapsulated with plastic in the form of a connector plug.

As illustrated in FIG. 3, the arrangement of FIG. 1 is encapsulated with plastic material 20, for example thermoplastic or duroplastic synthetic material, for example is extrusion coated or pressure coated such that the arrangement receives the shape of a connector plug 1 with web 2 having bores therethrough. Additional insulating portions of the ends of the RF suppression filter are consequently superfluous. In addition, this type of fashioning of the connector plug provides that the same can be manufactured in an extremely space-saving manner and considerable simplified in terms of production technology, and particularly when a plurality of insulating laminae 6, 6', respectively equipped with the ground conductors 13, with the power supply terminals and the device terminals according to FIGS. 1 and 2 are combined via insulating webs 6" to form a system carrier such that all systems can be respectively processed in common work steps and can be finally separated from one another.

Figure 4:
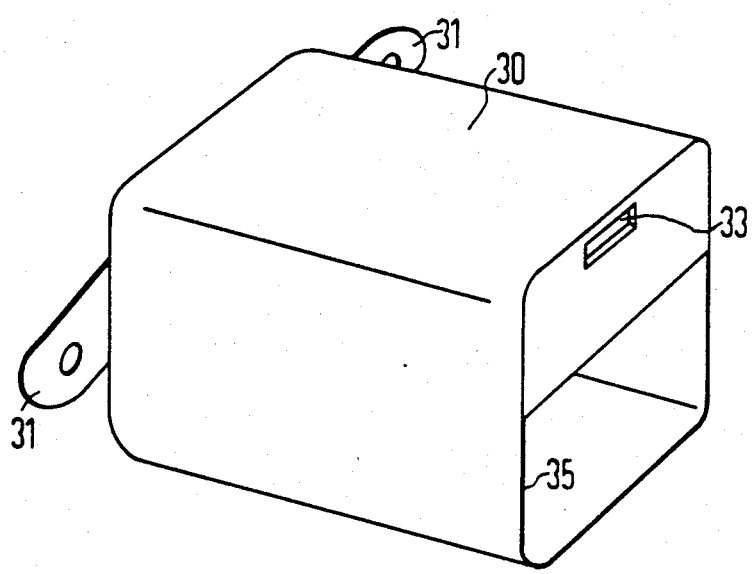
FIG. 4 is a perspective view of a filter housing which is suitable for plugging on to the device of FIG. 3.

Referring to FIG. 3, finally, the filter housing 30 of FIG. 4 fashioned with perforate webs 31 is mounted over the apparatus of FIG. 3. The free ends of the terminal 17 extend out of the opening 35 of the filter housing and the portion 12 of the ground conductor extends out through a slot 33 in the filter housing. The filter housing 30 which has its webs 31 pressing against the webs 2 of the plug 1 in the assembled condition is screwed thereto by way of screws extending through the bores and is electrically connected to the ground conductor in the completely assembled condition of the overall arrangement, for example, by way of ultrasonic welding.

Instead of the aforementioned contacting of the ground conductor to the filter housing 30, a metallic lamina 25, particularly a copper-beryllium sheet can be soldered, welded or, for example, riveted to the ground conductor, for example at the power supply side ground conductor part 4, this sheet projecting beyond the surface of the plastic encapsulation 20 with, for example, a part indicated with shading in FIG. 3 and pressing resiliently against the inner surface of the filter housing 30 slipped onto the plug 1. The above-described contacting of the ground conductor to the filter housing by way of ultrasonic welding is thereby eliminated.

Figure 5:
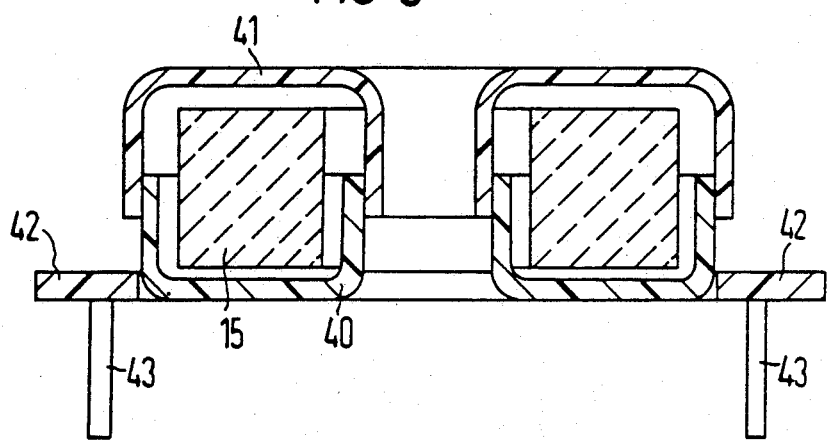
FIG. 5 is a partially broken view of a toroidal core inductor intended as a filter component and employed in an insulating container.

Referring to FIG. 5, finally, a low-expense possibility for the separate winding of the toroidal core inductor 15 which can be subsequently plugged into the insulating lamina 6 and can be electrically contacted to the corresponding terminals by immersion soldering is illustrated. The bores and the slots and, consequently, the engagement of the winding ends into the slots 9, 11 necessary with the embodiment of FIG. 1 are thereby superfluous. The already wound toroidal core inductor 15 is inserted into an insulating vessel composed of two annular shell halves 40, 41 which are plugged into one another. Webs 42 having electrical connector pins 43 are applied to the lower shell half, the winding ends in the final winding operation being wound onto these electrical connector pins 43.

Although we have described our invention by reference to particular illustrative embodiments thereof, many changes and modifications of the invention may become apparent to those skilled in the art without departing from the spirit and scope of the invention. We therefore intend to include all such changes and modifications as may reasonably and properly be included within the scope of our contribution to the art.

We claim:

1. In an electrical connector plug of the type having load terminals which extend via electrical conductors through a metallic filter housing to power supply terminals including a ground conductor electrically connected to the metallic filter housing, and in which filter components are disposed in the metallic filter housing and have leads interconnected with the electrical conductors to form a radio frequency suppression filter, the improvement wherein:
   an insulating lamina is provided and includes openings therethrough and defines a separating barrier between the filter components and the ground conductor;
   the ground conductor comprises a wide central area for connection to respective power supply terminals by way of respective Y-capacitors;
   the filter component leads extend through the openings of the lamina and are interconnected on the opposite side of the lamina with the load terminals and power supply terminals;
   a plastic material encapsulates the components, the lamina and the electrical conductors, including the ground conductor, to form a plug with the terminals extending therefrom; and
   the metallic housing is mounted on the plug and comprises openings for receiving the terminals, including the ground conductor, therethrough.

2. The improved electrical connector plug of claim 1, wherein:
   the ground conductor comprises a cross-shaped member.

3. The improved electrical connector plug of claim 1, wherein:
   the insulating lamina is carried on the ground conductor.

4. The improved electrical connector plug of claim 3, wherein:
   the power supply and utilization device terminals are carried on the insulating lamina.

5. The improved electrical connector plug of claim 1, wherein:
   the openings of the insulated lamina comprise bores and slots extending from the bores to respective edges of the lamina.

6. The improved electrical connector plug of claim 1, wherein:
   one of the filter components comprises a toroidal core inductor;
   a pair of insulating shell halves are plugged together with the inductor therein;
   integral webs are on one shell half; and
   connector pins are on said integral webs connected to the leads of the inductor and pluggable through respective lamina openings.

7. The improved electrical connector plug of claim 1, wherein:
   the electrical connection of the protective conductor to the metallic housing is at the utilization device end.

8. The improved electrical connector plug of claim 1, wherein:
   the electrical connection of the protective conductor to the metallic comprises a flexible metal sheet connected to the ground conductor and extending through the plastic material to resiliently engage the inner surface of the metallic housing.

9. The improved electrical connector plug of claim 8, wherein:
   the flexible metal sheet comprises a copper-beryllium sheet.

10. A radio frequency suppression filter, comprising:
    a plurality of input terminals, and a plurality of output terminals;
    a plurality of filter components each including electrical leads;
    a plurality of electrical conductors, including said leads and a ground conductor extending through said filter, said plurality of electrical conductors and filter components interconnected to form a radio frequency suppression filter;
    an insulating lamina carring said ground conductor and separating the same from said filter components, said lamina including openings for receiving some of said leads therethrough and said ground conductor including a wide section for connection to said some of said leads of said filter components via respective ones of said openings;
    encapsulating means encapsulating said lamina, said filter components and said ground conductor to form a structure with said input and output terminals extending therefrom; and
    a metallic filter housing about said structure electrically connected to said ground conductor.

11. A manufacturing process for making radio frequency filters, comprising the steps of:
    applying to one side of each of a plurality of insulating laminae, each having openings therethrough and connected in series by insulating webs, a ground conductor having first and second end terminals;

applying a plurality of first and a plurality of second end terminals to the same side of each of the lamina at respective ends thereof;

positioning the electrical leads of filter components through respective openings from the other side of each lamina and electrically interconnecting the same and the first and second terminals and first and second end terminals of the ground conductor to form a respective radio frequency filter for each lamina;

encapsulating each of the lamina, filter components and ground conductor in plastic material such that the terminals extend out of the encapsulation;

severing the encapsulated structures at the webs;

placing a respective metallic housing over the encapsulated structures; and electrically connecting each of the ground conductors to the respective housing.

* * * * *